United States Patent
Paseuth et al.

(10) Patent No.: US 9,994,958 B2
(45) Date of Patent: Jun. 12, 2018

(54) COATING, CUTTING TOOL, AND METHOD OF MANUFACTURING COATING

(71) Applicant: SUMITOMO ELECTRIC HARDMETAL CORP., Itami-shi (JP)

(72) Inventors: Anongsack Paseuth, Sorachi-gun (JP); Hideaki Kanaoka, Sorachi-gun (JP); Susumu Okuno, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 93 days.

(21) Appl. No.: 15/001,746

(22) Filed: Jan. 20, 2016

(65) Prior Publication Data
US 2017/0204513 A1 Jul. 20, 2017

(51) Int. Cl.
- B23B 27/14 (2006.01)
- C23C 16/56 (2006.01)
- C23C 16/34 (2006.01)
- C23C 28/04 (2006.01)
- C23C 28/00 (2006.01)

(52) U.S. Cl.
CPC .............. *C23C 16/56* (2013.01); *C23C 16/34* (2013.01); *C23C 28/042* (2013.01); *C23C 28/044* (2013.01); *C23C 28/42* (2013.01)

(58) Field of Classification Search
USPC .......... 51/307, 309; 428/212, 216, 336, 697, 428/698, 699
See application file for complete search history.

(56) References Cited

U.S. PATENT DOCUMENTS

| | | | | |
|---|---|---|---|---|
| 6,395,379 | B1* | 5/2002 | Braendle | C23C 14/0664 428/698 |
| 7,749,594 | B2* | 7/2010 | Angstrand | C23C 14/0641 428/216 |
| 2004/0026236 | A1* | 2/2004 | Penich | C23C 14/024 428/704 |
| 2004/0110039 | A1 | 6/2004 | Horling et al. | |

(Continued)

FOREIGN PATENT DOCUMENTS

| | | |
|---|---|---|
| JP | H06-136514 A | 5/1994 |
| JP | 07-205362 | 8/1995 |

(Continued)

OTHER PUBLICATIONS

Weirather et al "Increased thermal stability of Ti(1-x)Al(x)N/TiN mulitlayer coatings through high temperature sputter deposition on powder-metallurigacl high-speed steels" Surf & Coat Techn 257 (2014) p. 48-57.*

(Continued)

*Primary Examiner* — Archene Turner
(74) *Attorney, Agent, or Firm* — Venable LLP; Michael A. Sartori; Kerri M. Patterson (57) ABSTRACT

A coating is formed from one layer or two or more layers, at least one of the layers includes a multi-layer structure in which a first unit layer composed of TiN and a second unit layer composed of $Ti_{1-x}Al_xN$ are alternately stacked, the first unit layer has an fcc crystal structure, and the second unit layer has an fcc crystal structure, X in $Ti_{1-x}Al_xN$ being not smaller than 0.6 and not greater than 0.9.

5 Claims, 2 Drawing Sheets

(56) References Cited

U.S. PATENT DOCUMENTS

| | | | | |
|---|---|---|---|---|
| 2009/0068450 | A1* | 3/2009 | Muenz | C23C 14/0641 |
| | | | | 428/336 |
| 2009/0123779 | A1* | 5/2009 | Endler | C23C 16/34 |
| | | | | 428/697 |
| 2011/0111197 | A1 | 5/2011 | Johansson et al. | |
| 2014/0234616 | A1* | 8/2014 | Hultman | C23C 14/0641 |
| | | | | 428/336 |

FOREIGN PATENT DOCUMENTS

| | | |
|---|---|---|
| JP | 2008-545063 A | 12/2008 |
| WO | 2009/127344 | * 10/2009 |

OTHER PUBLICATIONS

Notice of Grounds of Rejection in Japanese Patent Application No. 2013-183946, dated Jan. 24, 2017.
Knutsson et al., "Thermally enhanced mechanical properties of arc evaporated Ti0.34Al0.66NfTiN multilayer coatings," Journal of Applied Physics 108, 044312, 2010, pp. 044312-1-044312-7.

* cited by examiner

COATING, CUTTING TOOL, AND METHOD OF MANUFACTURING COATING

BACKGROUND OF THE INVENTION

Field of the Invention

The present invention relates to a coating, a cutting tool, and a method of manufacturing a coating, and particularly to a coating excellent in resistance to oxidation and hardness, a cutting tool including the coating, and a method of manufacturing the coating.

Description of the Background Art

Steel or a casting has conventionally been cut with a cutting tool composed of cemented carbide. Since a cutting edge of such a cutting tool is exposed to a severe environment such as a high temperature or a high pressure during cutting, wear or chipping of the cutting edge tends to occur. Thus, cutting performance of a cutting tool presents a challenge.

In order to improve cutting performance of a cutting tool, a coating for a surface of a substrate composed of cemented carbide or the like has been developed. Among others, a coating composed of a nitride containing titanium and aluminum (hereinafter also referred to as "$Ti_{1-x}Al_xN$") can have high hardness and enhanced resistance to oxidation resulting from increase in content x of Al. By coating a cutting tool with such a coating, performance of the cutting tool can noticeably be improved and further development of the coating is expected.

For example, Japanese Patent Laying-Open No. 7-205362 discloses a coating having a multi-layer structure in which composition is continuously varied with a period of a TiN layer and an AlN layer from 0.4 nm to 50 nm. $Ti_{1-x}Al_xN$ seems to be present in the period of the multi-layer structure. This coating, however, is formed with physical vapor deposition (PVD), and hence x in $Ti_{1-x}Al_xN$ could not be designed to be higher than 0.55. Therefore, resistance to oxidation of this coating has been limited and further improvement has been demanded.

Japanese National Patent Publication No. 2008-545063 discloses a technique for fabricating a coating composed of $Ti_{1-x}Al_xN$ with chemical vapor deposition (CVD). Japanese National Patent Publication No. 2008-545063 discloses a coating having a face-centered cubic structure (hereinafter also referred to as an "fcc crystal structure") in which x in $Ti_{1-x}Al_xN$ satisfies a condition of $0.75<x\leq0.93$.

SUMMARY OF THE INVENTION

In the coating disclosed in Japanese National Patent Publication No. 2008-545063, however, AlN having a hexagonal close-packed structure (hereinafter also referred to as an "hcp crystal structure") may precipitate in the fcc crystal structure. Precipitated AlN having the hcp type crystal structure (hereinafter also referred to as "hcp-AlN") is present as a defect in the coating, which leads to lowering in hardness and resistance to oxidation of the coating.

Namely, in a conventional coating, it has been difficult to sufficiently exhibit characteristics of both of high hardness and high resistance to oxidation which can be exhibited by $Ti_{1-x}Al_xN$. Therefore, a coating having high hardness and high resistance to oxidation which can be exhibited by $Ti_{1-x}Al_xN$ has not been realized and improvement in performance of a cutting tool owing to the coating has not been achieved.

The present invention was made in view of the circumstances as above, and an object of the present invention is to provide a coating which can have high hardness and high resistance to oxidation which can be exhibited by $Ti_{1-x}Al_xN$.

The present invention is directed to a coating formed from one layer or two or more layers, at least one layer of the layers including a multi-layer structure in which a first unit layer composed of TiN and a second unit layer composed of $Ti_{1-x}Al_xN$ are alternately stacked, the first unit layer having an fcc crystal structure, and the second unit layer having an fcc crystal structure, x in $Ti_{1-x}Al_xN$ being not smaller than 0.6 and not greater than 0.9.

The present invention is directed to a cutting tool which includes a substrate and the coating with which the substrate is coated.

The present invention is directed to a method of manufacturing a coating formed on a substrate and formed from one layer or two or more layers, and the method includes a CVD step of forming at least one layer of the layers with CVD, the CVD step including an injection step of injecting a first gas containing titanium and aluminum and a second gas containing nitrogen toward the substrate, an annealing step of annealing the substrate which has been subjected to the injection step under a heating condition not lower than 850° C. and not higher than 1000° C. for a period not shorter than 5 minutes and not longer than 30 minutes, and a cooling step of cooling the annealed substrate at a cooling rate not less than 7° C./min.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Description of Embodiment of the Invention of the Subject Application]

Overview of an embodiment of the present invention will initially be described.

The present inventors have conducted various studies in order to realize a coating which can sufficiently exhibit characteristics of both of high hardness of $Ti_{1-x}Al_xN$ and high resistance to oxidation resulting from increase in content x of Al.

Specifically, since it is substantially difficult to design a content x to a numeric value higher than 0.55 with PVD, the present inventors have initially attempted to fabricate an aimed coating composed of $Ti_{1-x}Al_xN$ with CVD. Then, as a result of various studies, it has been found that a frequency of precipitation of hcp-AlN is higher with increase in x, and among others, when x is not smaller than 0.7, precipitation of hcp-AlN is noticeable.

Such precipitation of AlN may be caused by a great strain in a crystal structure when x in $Ti_{1-x}Al_xN$ having the fcc crystal structure (hereinafter also referred to as "fcc-Ti$_{1-x}$Al$_x$N") is large, in particular, when x is not smaller than 0.7. Namely, it is considered that when x in fcc-Ti$_{1-x}$Al$_x$N increases, phase transition for stabilizing the crystal structure occurs and thus hcp-AlN precipitates together with TiN having the fcc crystal structure (hereinafter also referred to as "fcc-TiN"). Precipitated hcp-AlN is present as a defect in a coating as described previously, which in turn becomes a factor for lowering in hardness and resistance to oxidation of the coating.

Then, the present inventors have continued dedicated studies in order to suppress phase transition of Ti$_{1-x}$Al$_x$N. Then, the present inventors have conceived that phase transition can be suppressed by sandwiching a layer composed of fcc-Ti$_{1-x}$Al$_x$N between layers composed of fcc-TiN in a direction of thickness, instead of allowing fcc-Ti$_{1-x}$Al$_x$N to be present simply as a single layer in the coating, and have completed a coating according to the present invention and a cutting tool having the coating. The coating could be manufactured for the first time by employing a manufacturing method according to the present invention in which conditions completely different from those in a conventional example have been adopted in CVD.

(1) Namely, a coating according to the present embodiment is formed from one layer or two or more layers, at least one layer of the layers includes a multi-layer structure in which a first unit layer composed of TiN and a second unit layer composed of Ti$_{1-x}$Al$_x$N are alternately stacked, the first unit layer has an fcc crystal structure, and the second unit layer has an fcc crystal structure, x in Ti$_{1-x}$Al$_x$N being not smaller than 0.6 and not greater than 0.9.

According to the coating in the present embodiment, since the second unit layer composed of Ti$_{1-x}$Al$_x$N and the first unit layer composed of TiN are alternately stacked, the second unit layer can be sandwiched between the first unit layers in a direction of thickness. Thus, x in Ti$_{1-x}$Al$_x$N can be maintained to a high numeric value not smaller than 0.6 and not greater than 0.9 in the second unit layer and precipitation of hcp-AlN in the second unit layer can be suppressed. Therefore, the coating according to the present embodiment can have high hardness and high resistance to oxidation.

(2) In the coating according to the present embodiment, preferably, the second unit layer exhibits a peak highest in intensity in an X-ray diffraction spectrum, which is derived from a (111) plane or a (200) plane. When the peak derived from the (200) plane exhibits the highest intensity, a surface of the second unit layer is particularly smoother than in other cases, and thus resistance to adhesion of the coating improves. When the peak derived from the (111) plane exhibits the highest intensity, the surface of the second unit layer is a crystal plane particularly more stable than in other cases and thus hardness of the coating improves.

(3) In the coating according to the present embodiment, preferably, in the multi-layer structure, a distance between the first unit layers adjacent to each other with the second unit layer lying therebetween is not smaller than 10 nm and not greater than 40 nm. In this case, the coating can have particularly high hardness and in addition can have high toughness.

(4) In the coating according to the present embodiment, preferably, the second unit layer has compressive residual stress of which absolute value is not greater than 2 GPa. Thus, the coating can have high resistance to chipping.

(5) A cutting tool according to the present embodiment is a cutting tool including a substrate and the coating with which the substrate is coated.

According to the cutting tool in the present embodiment, since the substrate is coated with the coating having high hardness and high resistance to oxidation described above, high hardness and high resistance to oxidation can be exhibited during cutting and hence cutting performance is excellent.

(6) In the cutting tool according to the present embodiment, preferably, the substrate is composed of WC-based cemented carbide or cermet. Thus, higher hardness and high resistance to oxidation can be exhibited.

(7) A manufacturing method according to the present embodiment is a method of manufacturing a coating formed on a substrate and formed from one layer or two or more layers, and the method includes a CVD step of forming at least one layer of the layers with CVD. The CVD step includes an injection step of injecting a first gas containing titanium and aluminum and a second gas containing nitrogen toward the substrate, an annealing step of annealing the substrate which has been subjected to the injection step under a heating condition not lower than 850° C. and not higher than 1000° C. for a period not shorter than 5 minutes and not longer than 30 minutes, and a cooling step of cooling the substrate which has been subjected to the annealing step at a cooling rate not less than 7° C./min.

According to the manufacturing method in the present embodiment, one layer containing titanium, aluminum, and nitrogen which has been formed in the injection step can undergo phase transition (separation and precipitation) into the first unit layer and the second unit layer by annealing the substrate which has been subjected to the injection step under the conditions above and cooling the resultant substrate at the cooling rate above, and thus a layer having the multi-layer structure can be formed. Therefore, according to the present embodiment, a coating having high hardness and high resistance to oxidation can be manufactured.

[Details of the Embodiment of the Invention of the Subject Application]

An embodiment of the present invention will be described in detail hereinafter with reference to the drawings. In the drawings below, the same or corresponding elements in the drawings below have the same reference characters allotted and description thereof will not be repeated. When composition of each layer forming a hard coating is expressed with a chemical formula such as "TiAlN" or "TiN" herein and when an atomic ratio is not particularly limited, all atomic ratios that have conventionally been known are encompassed and the atomic ratio is not necessarily limited only to those in a stoichiometric range. For example, when composition is simply denoted as "TiN", the atomic ratio between "Ti" and "N" is not limited only to 50:50 (1:1) and all atomic ratios that have conventionally been known are encompassed as the atomic ratio.

<<Coating>>

The coating according to the present embodiment is formed from one layer or two or more layers, and at least one of the layers includes a multi-layer structure in which a first unit layer composed of TiN and a second unit layer composed of Ti$_{1-x}$Al$_x$N are alternately stacked. As will be described later, the first unit layer has the fcc crystal structure and the second unit layer has the fcc crystal structure, with x in Ti$_{1-x}$Al$_x$N being not smaller than 0.6 and not greater than 0.9. An atomic ratio between "Ti$_{1-x}$Al$_x$" and "N" in "Ti$_{1-x}$Al$_x$N" is not limited to 50:50 (1:1) as above and all atomic ratios which have conventionally been known are encompassed.

According to the coating in the present embodiment, in the layer including the multi-layer structure (hereinafter also referred to as a "multi-layer-structure-containing layer"), the second unit layer composed of $Ti_{1-x}Al_xN$ and the first unit layer composed of TiN are alternately stacked and hence the second unit layer can be sandwiched between the first unit layers in a direction of thickness. Thus, in spite of the fact that x in $Ti_{1-x}Al_xN$ can be maintained at a high numeric value not smaller than 0.6 and not greater than 0.9 in the second unit layer, precipitation of hcp-AlN in the second unit layer can be suppressed. Therefore, according to the coating in the present embodiment, characteristics of $Ti_{1-x}Al_xN$ can be made best use of and hence the coating can have high hardness and high resistance to oxidation.

The entire coating has a thickness preferably not smaller than 3 μm and not greater than 30 μm. As the entire coating has a thickness not smaller than 3 μm, lowering in hardness due to a small thickness of the entire coating can be prevented. The entire coating having a thickness not greater than 30 μm can prevent chipping of the coating due to a large thickness of the entire coating. The entire coating has a thickness more preferably not smaller than 5 and not greater than 20 μm and further preferably not smaller than 7 μm and not greater than 15 μm.

A thickness of the entire coating can be measured, for example, by forming a coating on any substrate, cutting the coating at any position, and observing a cross-section thereof with a scanning electron microscope (SEM) or a transmission electron microscope (TEM). A sample for observing a cross-section can be prepared, for example, with the use of a focused ion beam (FIB) system or a cross-section polisher (CP).

So long as the coating according to the present embodiment includes at least one multi-layer-structure-containing layer described above, it can include a layer other than this, and even when it includes other layer, a noticeable effect described above can be achieved. Examples of other layer includes an underlying layer provided between the multi-layer-structure-containing layer and the substrate and a surface protection layer provided on the multi-layer-structure-containing layer.

<Multi-Layer-Structure-Containing Layer>

The multi-layer-structure-containing layer included in the coating described above will be described below in detail.

Figure 1:
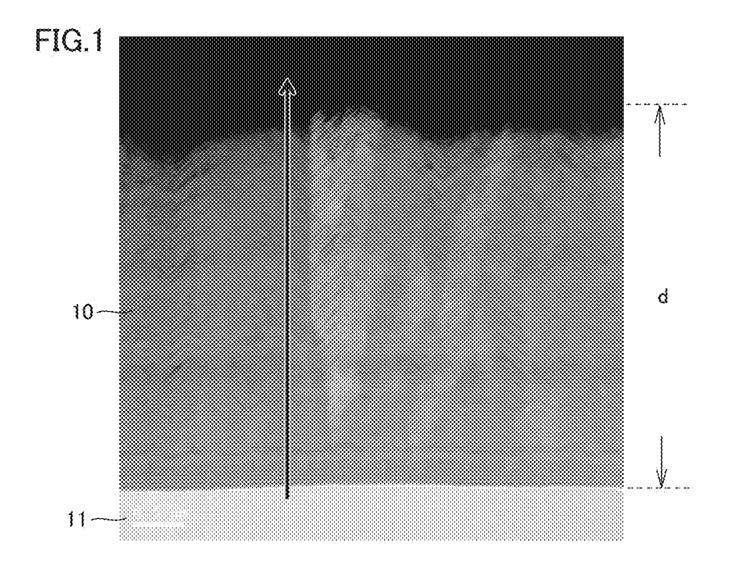
FIG. 1 is a diagram of a coating according to the present embodiment provided on a substrate, which shows a TEM photograph corresponding to a case that the coating is formed from one layer and one layer includes a multi-layer structure.
Figure 2:
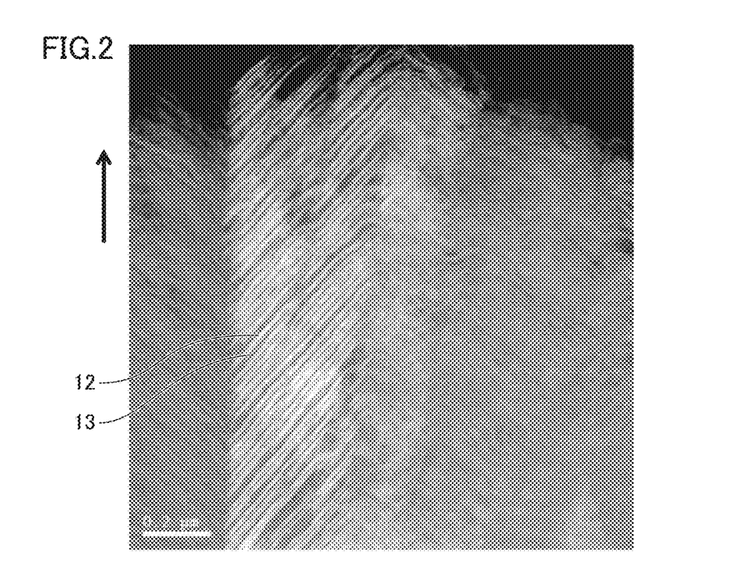
FIG. 2 is a diagram showing a TEM photograph in which a main portion in FIG. 1 is enlarged.

FIG. 1 is a diagram of the coating according to the present embodiment provided on the substrate, which shows a TEM photograph corresponding to a case that the coating is formed from one layer and one layer is the multi-layer-structure-containing layer. FIG. 2 is a diagram showing a TEM photograph in which a main portion in FIG. 1 is enlarged.

Referring to FIGS. 1 and 2, the multi-layer-structure-containing layer forming a coating 10 with which a surface of a substrate 11 is coated includes the multi-layer structure in which a first unit layer 12 (a light color portion in the multi-layer structure shown in FIG. 2) and a second unit layer 13 (a dark color portion in the multi-layer structure shown in FIG. 2) are alternately stacked. First unit layer 12 is composed of fcc-TiN and second unit layer 13 is composed of fcc-$Ti_{1-x}Al_xN$, with x in $Ti_{1-x}Al_xN$ being not smaller than 0.6 and not greater than 0.9.

Composition of the multi-layer-structure-containing layer forming coating 10 can be determined, for example, with an energy dispersive X-ray spectroscope (EDX) equipped with an SEM or a TEM. A crystal structure of each layer can be determined, for example, with an X-ray diffraction (XRD) apparatus. Though a case that coating 10 is formed from one layer is exemplified in the present embodiment, composition of each layer forming coating 10 can be determined with a similar method even when coating 10 is formed from two or more layers. The multi-layer-structure-containing layer may contain an inevitable impurity such as oxygen (O), nitrogen (N), or carbon (C).

The entire multi-layer-structure-containing layer has a thickness d preferably not smaller than 1 μm and not greater than 20 μm. As the entire multi-layer-structure-containing layer has thickness d not smaller than 1 μm, noticeable improvement in characteristics of coating 10 derived from characteristics of the multi-layer-structure-containing layer can be achieved. When thickness d of the entire multi-layer-structure-containing layer exceeds 20 μm, significant change in improvement in characteristics of coating 10 derived from characteristics of the multi-layer-structure-containing layer is not observed and hence such a case is not economically advantageous. The entire multi-layer-structure-containing layer has thickness d more preferably not smaller than 2 μm and not greater than 15 μm and further preferably not smaller than 5 μm and not greater than 10 μm.

As shown in FIGS. 1 and 2, the multi-layer-structure-containing layer has a columnar crystal region, and in the columnar crystal region, a construction is such that first unit layer 12 and second unit layer 13 are alternately stacked with respect to a direction of a major axis of columnar crystals (a direction shown with an arrow in each of FIGS. 1 and 2). The multi-layer-structure-containing layer may be formed only of the columnar crystal regions in its entirety, or may have crystal regions other than the columnar crystal regions. In order to effectively exhibit superior characteristics of coating 10 owing to the presence of the multi-layer structure, the columnar crystal region having the multi-layer structure accounts for preferably 50 volume % or more and more preferably 70 volume % or more of the multi-layer-structure-containing layer.

Here, the columnar crystal region refers to a region formed from columnar crystals, and such columnar crystals grow in a direction close to a direction of a normal (a vertical direction in FIG. 1) to the surface of substrate 11, in other words, the direction of thickness of the multi-layer-structure-containing layer, rather than in a direction along a plane (a lateral direction in FIG. 1) of substrate 11. Such a columnar crystal has, for example, a width (a diameter) from 50 to 500 nm and a length in connection with a direction of growth from 1000 to 10000 nm.

The multi-layer structure having the columnar crystal region is such a multi-layer structure that first unit layer 12 and second unit layer 13 are periodically repeatedly stacked with second unit layer 13 lying between first unit layers 12. Here, being periodically repeatedly stacked naturally includes a case that first unit layer 12 and second unit layer 13 are vertically alternately stacked and also a case that not only first unit layer 12 and second unit layer 13 but also another third unit layer are alternately repeatedly stacked as upper, intermediate, and lower layers. For example, a layer composed of AlN having an fcc crystal structure (hereinafter also referred to as "fcc-AlN") can be exemplified as the third unit layer.

As described above, first unit layer 12 is composed of fcc-TiN. Fcc-TiN is a stable crystal structure and has high thermal stability. Since precipitation of hcp-AlN in second unit layer 13 can be suppressed by sandwiching second unit layer 13 between first unit layers 12 in the direction of thickness, layers located at opposing ends of the multi-layer structure in the direction of thickness are preferably first unit layers 12. Thus, all second unit layers 13 can be sandwiched between first unit layers 12.

Second unit layer 13 is composed of fcc-$Ti_{1-x}Al_xN$ as described above, with x in $Ti_{1-x}Al_xN$ being not smaller than 0.6 and not greater than 0.9. Fcc-$Ti_{1-x}Al_xN$ having such a high numeric value of x has resistance to oxidation particularly higher, for example, than fcc-$Ti_{1-x}Al_xN$ having x not greater than 0.55. Here, x in $Ti_{1-x}Al_xN$ being not smaller than 0.6 and not greater than 0.9 means that an average value of an Al content in $Ti_{1-x}Al_xN$ is not smaller than 0.6 and not greater than 0.9. Therefore, for example, in the multi-layer structure, x in $Ti_{1-x}Al_xN$ in a region of second unit layer 13 in contact with first unit layer 12 may be smaller than 0.6, or, for example, x in $Ti_{1-x}Al_xN$ in a region of second unit layer 13 most distant from adjacent first unit layers 12, that is, an intermediate region in second unit layer 13 in the direction of thickness, may exceed 0.9.

An average value of the Al content in $Ti_{1-x}Al_xN$ can be calculated, for example, as follows. Namely, initially, composition in a plurality of any regions different in a direction of thickness and in an in-plane direction of second unit layer 13 (for example, at least five points distant from one another by 1 nm in the direction of thickness and 0.5 μm in the in-plane direction) is analyzed with EDX. Thus, information on composition in the regions located at a plurality of locations in the second unit layer is obtained. Then, the contents of Al obtained from the composition information are averaged so as to be able to calculate an average value x of the Al content in $Ti_{1-x}Al_xN$.

In connection with second unit layer 13, the peak derived from the (111) plane or the (200) plane preferably exhibits the highest intensity in an X-ray diffraction spectrum of second unit layer 13.

When second unit layer 13 grows on a growth face of the (200) plane of $Ti_{1-x}Al_xN$, the peak derived from the (200) plane exhibits the highest intensity in the X-ray diffraction spectrum. In this case, the surface of second unit layer 13 tends to particularly be smoother than in a case that second unit layer 13 grows on a growth face which is not the (200) plane. As the surface of second unit layer 13 is smooth, each surface of the multi-layer structure and hence the multi-layer-structure-containing layer itself become smooth. Therefore, the multi-layer-structure-containing layer can have high resistance to adhesion.

When second unit layer 13 grows on a growth face of the (111) plane of $Ti_{1-x}Al_xN$, the peak derived from the (111) plane exhibits the highest intensity in the X-ray diffraction spectrum. In this case, the surface of second unit layer 13 tends to be a crystal plane particularly more stable than in a case that second unit layer 13 grows on a growth face which is not the (111) plane. As the surface of second unit layer 13 is the stable crystal plane, each surface of the multi-layer structure and hence the multi-layer-structure-containing layer itself become stable. Therefore, the multi-layer-structure-containing layer can have high resistance to wear.

Therefore, in connection with coating 10 in the present embodiment, when the peak derived from the (200) plane exhibits the highest intensity in the X-ray diffraction spectrum of second unit layer 13, resistance to adhesion of coating 10 can particularly be improved, and when the peak derived from the (111) plane exhibits the highest intensity, resistance to wear in particular of coating 10 can be improved.

In second unit layer 13, an absolute value of compressive residual stress is preferably not greater than 2 GPa. "Compressive residual stress" here refers to one type of internal stress (intrinsic strain) present in coating 10, and to stress expressed by a "−" (minus) numeric value (unit: "GPa" in the present invention). Therefore, a concept of large compressive residual stress means that an absolute value of a numeric value is great, and a concept of small compressive residual stress means that an absolute value of a numeric value is small. Namely, an absolute value of compressive residual stress being not greater than 2 GPa means that preferred compressive residual stress of second unit layer 13 is not smaller than −2 GPa and smaller than 0 GPa.

As the absolute value of compressive residual stress in second unit layer 13 is not greater than 2 GPa, a strain of appropriate magnitude is maintained in the multi-layer-structure-containing layer, and thus resistance to chipping of coating 10 improves. The absolute value of compressive residual stress in second unit layer 13 is more preferably not greater than 1 GPa, further preferably not smaller than 0.2 GPa and not greater than 0.8 GPa, and yet further preferably not smaller than 0.4 GPa and not greater than 0.8 GPa.

The reason why the absolute value of compressive residual stress in second unit layer 13 can be set to 2 GPa or smaller may be because x in $Ti_{1-x}Al_xN$ making up second unit layer 13 is not smaller than 0.6 and not greater than 0.9 and second unit layer 13 is sandwiched between first unit layers 12. For example, when x is smaller than 0.6, second unit layer 13 tends to have tensile residual stress. When x exceeds 0.9, compressive residual stress in second unit layer 13 tends to be large.

Such compressive residual stress can be measured with a $\sin^2 \psi$ method using an X-ray stress measurement apparatus. Specifically, a $2\theta$-$\sin^2 \psi$ plot was drafted by measuring with a side inclination method, angles of diffraction $2\theta$ with respect to various $\psi$ directions in a plane including a direction of stress to be measured and a normal to a surface of a specimen set at a measurement position with a depth of penetration of X-rays (an arbitrary point where second unit layer 13 exists) being fixed, and an average value for residual stress to that depth (a distance from a surface of a coating) can be found based on a gradient of the plot. Ψ is set to an angle between 0 to 70°, and the number of arbitrary points is set to 5 to 9. Each arbitrary point can be, for example such a point that an interval between values for $\sin^2 \psi$ is equal. $2\theta$ is set to 44° where a diffraction peak of (200) of AlTiN appears.

Measurement above can be made, for example, with "SmartLab™" manufactured by Rigaku Corporation. A source of X-rays used here is Cu-Kα. In order to find residual stress based on the $2\theta$-$\sin^2 \psi$ plot as above, a Young's modulus and a Poisson's ratio of the coating are required. For these values, a Young's modulus of TiN (429 GPa) and a Poisson's ratio of TiN (0.19) are employed.

Points in measurement at a plurality of points are preferably selected such that they are distant from one another in the in-plane direction by 0.1 mm or more so as to be able to represent a stress in second unit layer 13. Regarding second unit layers 13 which are present in large number in the vertical direction, compressive residual stress not in one layer but in each of two layers is preferably measured, compressive residual stress in each of three to five layers is more preferably measured, and compressive residual stress in each of ten or more layers is preferably measured.

Such an $\sin^2 \psi$ method using an X-ray is widely used as a method of measuring residual stress in a polycrystalline material, and the method described in detail on pages 54-67 of "X-ray Stress Measurement" (The Society of Materials Science, Japan, 1981, published by Yokendo Co., Ltd.) may be used.

Compressive residual stress can also be measured by making use of a method with the use of Raman spectroscopy. Such Raman spectroscopy is advantageous in ability of local measurement in a narrow range such as a spot diameter of 1 μm. Though measurement of residual stress using such Raman spectroscopy is common, for example, a method described on pages 264 to 271 of "Hakumaku no Rikigakuteki Tokusei Hyouka Gijutu," (published by Sipec Corp. (company name having been changed to REALIZE Science & Engineering) in 1992) can be adopted.

A thickness of each of first unit layer 12 and second unit layer 13 is preferably not smaller than 3 nm and not greater than 30 nm. As each layer has a thickness not greater than 30 nm, a multi-layer structure in which those layers are stacked becomes a super multi-layer structure in which a large number of those layers are periodically repeatedly stacked. Thus, more noticeable improvement in hardness and resistance to oxidation in the multi-layer-structure-containing layer can be achieved and hence more noticeable improvement in hardness and resistance to oxidation of coating 10 can be achieved. As each layer has a thickness not smaller than 3 nm, noticeable improvement in characteristics of the multi-layer-structure-containing layer derived from the multi-layer structure can be achieved. A thickness of each of first unit layer 12 and second unit layer 13 is more preferably not smaller than 5 nm and not greater than 25 nm and further preferably not smaller than 10 nm and not greater than 20 nm.

When the multi-layer structure has other layer composed of fcc-AlN or the like, other layer has a thickness preferably not smaller than 3 nm and not greater than 30 nm similarly to first unit layer 12 and second unit layer 13, from a point of view of suppression of failure in exhibition of characteristics of the multi-layer structure due to non-uniformity in the multi-layer structure.

A thickness of each layer can be measured with an SEM or a TEM similarly to a thickness of the entire coating. The unit layers may be equal to or different from each other in thickness. Namely, for example, a plurality of first unit layers 12 may be equal to or different from each other in thickness, and first unit layer 12 and second unit layer 13 may be equal to or different from each other in thickness.

A distance between first unit layers 12 adjacent to each other with second unit layer 13 lying therebetween is preferably not smaller than 10 nm and not greater than 40 nm. Since precipitation of hcp-AlN can thus more noticeably be suppressed, the coating can have higher hardness. In this case, since the coating can have a super multi-layer structure constituted of a plurality of thin layers, it can have high toughness. Here, a distance between first unit layers 12 adjacent to each other with second unit layer 13 lying therebetween refers to a distance in the direction of thickness between two first unit layers 12 adjacent to each other with one second unit layer 13 lying therebetween and to a shortest distance from an intermediate position of one first unit layer 12 in the direction of thickness to an intermediate position of another first unit layer 12 in the direction of thickness.

Therefore, for example, in the multi-layer structure in which first unit layer 12 and second unit layer 13 are vertically alternately stacked, the distance has a value calculated by adding a distance corresponding to half a thickness of one first unit layer 12, a distance corresponding to a thickness of second unit layer 13 adjacent to one first unit layer 12, and a distance corresponding to half a thickness of another first unit layer 12 adjacent to second unit layer 13. When the multi-layer structure further includes a third unit layer, or for example, when first unit layer 12, second unit layer 13, and a third unit layer composed of fcc-AlN are alternately repeatedly stacked as upper, intermediate, and lower layers, the distance has a value calculated by adding a distance corresponding to half a thickness of one first unit layer 12, a distance corresponding to a thickness of second unit layer 13 adjacent to one first unit layer 12, a distance corresponding to a thickness of the third unit layer adjacent to second unit layer 13, and a distance corresponding to half a thickness of another first unit layer 12 adjacent to the third unit layer.

<Other Layer>

So long as the coating according to the present embodiment includes at least one multi-layer-structure-containing layer described above, it can include a layer other than this. Other layer is preferably a layer composed of a compound of one or more elements selected from the group consisting of titanium (Ti), zirconium (Zr), and hafnium (Hf) and one or more elements selected from the group consisting of nitrogen (N), oxygen (O), carbon (C), and boron (B). In this case, since other layer can also have relatively high hardness, hardness of the entire coating can further be enhanced. Examples of such a compound include TiN, TiB, TiBN, TiCO, TiBNO, TiCBN, TiCNO, ZrN, ZrCN, ZrN, $ZrO_2$, HOC, HfN, and HfCN. The compound may be doped with a small amount of another element.

Other layer is more preferably a layer composed of α-alumina (α-$Al_2O_3$) or κ-alumina (κ-$Al_2O_3$). Since such a layer composed of alumina has high resistance to oxidation, resistance to oxidation of the coating can further be enhanced. Among others, by providing a layer composed of alumina as a surface protection layer, the coating can be superior in resistance to oxidation.

<<Cutting Tool>>

The cutting tool according to the present embodiment is a cutting tool including the substrate and the coating with which the substrate is coated. Since the cutting tool according to the present embodiment has the coating having high hardness and high resistance to oxidation, it has drastically improved hardness and resistance to oxidation and hence has excellent cutting performance.

Examples of the cutting tool which can effectively exhibit the characteristics of the coating include a drill, an end mill, a throwaway tip for a drill, a throwaway tip for an end mill, a throwaway tip for milling, a throwaway tip for turning, a metal saw, a gear cutting tool, a reamer, and a tap.

A conventionally known substrate for such a cutting tool can be employed as the substrate for the cutting tool without being particularly limited. Examples of such a substrate include tungsten carbide (WC)-based cemented carbide, cermet, high-speed steel, ceramics, a cubic boron nitride sintered object, and a diamond sintered object. Among these, from a point of view of balance between hardness and toughness, WC-based cemented carbide or cermet is preferably employed for the substrate.

The coating of the cutting tool does not necessarily have to coat the entire surface of the substrate but should only be formed on at least a part of the surface, for example, at least a part of a rake face and a flank face. As the coating is formed on a part of such a face, in working a work material with the cutting tool, a beneficial effect owing to high hardness and high resistance to oxidation thereof can be exhibited. Since details of the coating of the cutting tool according to the present embodiment are the same as described above, description thereof will not be repeated.

<<Manufacturing Method>>

The coating can be manufactured with the manufacturing method according to the present embodiment. Namely, the coating manufactured with the manufacturing method according to the present embodiment can have high hardness and high resistance to oxidation. A cutting tool can be manufactured by providing the coating on a substrate for the cutting tool.

When the coating described above has a layer other than the multi-layer-structure-containing layer, conventionally known CVD can suitably be employed for such other layers. The multi-layer-structure-containing layer in the coating described above, however, cannot be manufactured with conventional known CVD, and it can be manufactured only with a specific CVD step below.

Namely, the manufacturing method according to the present embodiment is a method of manufacturing a coating formed on a substrate and formed from one layer or two or more layers, and the method includes a CVD step of forming at least one of the layers with CVD. The CVD step includes an injection step of injecting a first gas containing titanium and aluminum and a second gas containing nitrogen toward the substrate, an annealing step of annealing the substrate which has been subjected to the injection step under a heating condition not lower than 850° C. and not higher than 1000° C. for a period not shorter than 5 minutes and not longer than 30 minutes, and a cooling step of cooling the substrate which has been subjected to the annealing step at a cooling rate not less than 7° C./min. The CVD step for manufacturing the multi-layer-structure-containing layer will be described below in detail.

<CVD Step>

The CVD step is a step of forming with CVD, a multi-layer-structure-containing layer which is at least one of layers forming the coating described above. In this CVD step, a CVD apparatus shown in FIG. 3 can be employed.

Figure 3:
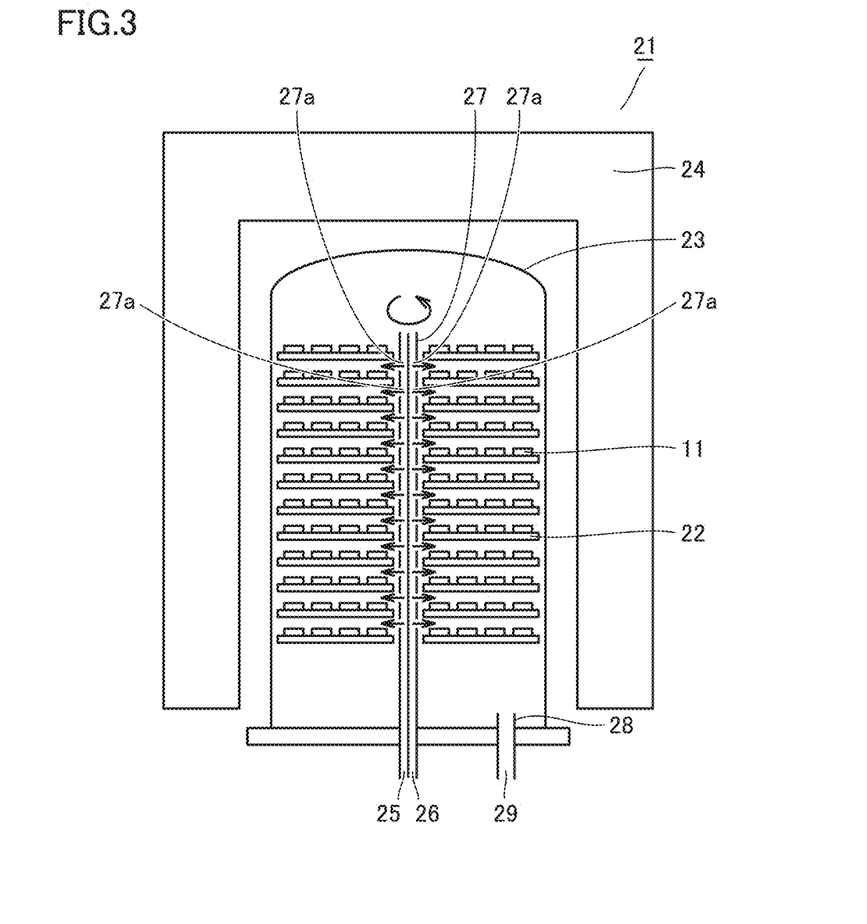
FIG. 3 is a schematic cross-sectional view of a CVD apparatus used in a CVD step in a manufacturing method in the present embodiment.

Referring to FIG. 3, a plurality of substrate setting jigs 22 for holding substrates 11 can be installed in a CVD apparatus 21 and they are covered with a reaction vessel 23 made of heat-resistant alloy steel. A temperature adjustment apparatus 24 is arranged around reaction vessel 23 and it can control a temperature in reaction vessel 23.

An introduction pipe 27 having two introduction ports 25 and 26 is arranged in reaction vessel 23. Introduction pipe 27 is arranged to pass through a region where substrate setting jigs 22 are arranged and a plurality of through holes 27a are formed in portions in the vicinity of substrate setting jigs 22. Gases introduced into introduction pipe 27 through respective introduction ports 25 and 26 pass through different through holes 27a without being mixed in introduction pipe 27, and are introduced in reaction vessel 23. This introduction pipe 27 can rotate with an axis thereof being defined as a central axis. An exhaust pipe 28 is arranged in CVD apparatus 21 so that an exhaust gas can be emitted from an exhaust port 29 to the outside. Jigs in reaction vessel 23 are normally composed of graphite. Each step which will be described later is explained with reference to FIG. 3.

<Injection Step>

In the present step, the first gas containing titanium and aluminum and the second gas containing nitrogen are injected toward the substrate. Prior to performing the present step, substrate 11 is arranged on substrate setting jig 22 in reaction vessel 23 of CVD apparatus 21 such that a site where a coating is to be formed is exposed in reaction vessel 23. Reaction vessel 23 is maintained in a high-temperature reduced-pressure environment.

Referring to FIG. 3, in the present step, the first gas is introduced into introduction pipe 27 through introduction port 25 and the second gas is introduced into introduction pipe 27 through introduction port 26. Introduction pipe 27 at this time is rotated around the axis thereof by a not-shown drive portion as shown with a rotating arrow in the figure.

Since a plurality of through holes 27a open on one end side (an upper side in the figure) of introduction pipe 27, the introduced first gas and second gas are injected into reaction vessel 23 through the plurality of different through holes 27a, respectively. Since introduction pipe 27 rotates, the first gas and the second gas are mixed in reaction vessel 23. Therefore, in the present step, a mixed gas in which the first gas and the second gas have been mixed is injected toward the surface of substrate 11 installed on substrate setting jig 22. Thus, the mixed gas reaches the exposed surface of substrate 11 and a layer composed of Ti, Al, and N (hereinafter also referred to as a "TiAlN layer") is formed as a growth layer composed of elements contained in this mixed gas.

A gas including a $TiCl_4$ gas and an $AlCl_3$ gas can be exemplified as the first gas containing titanium and aluminum. A gas containing $NH_3$ can be exemplified as the second gas containing nitrogen. A carrier gas may be introduced together with the first gas through introduction port 25 and a carrier gas may be introduced together with the second gas through introduction port 26. An $H_2$ gas, an $N_2$ gas, and an Ar gas are examples of the carrier gas.

In the present step, a temperature in reaction vessel 23 is preferably not lower than 700° C. and not higher than 900° C., and a pressure in reaction vessel 23 is maintained preferably to a pressure not lower than 0.1 kPa and not higher than 13 kPa. Thus, the TiAlN layer can efficiently be formed.

A thickness of the growth layer can be controlled by adjusting a duration of the present step. For example, a thickness of the growth layer can be decreased by decreasing a duration of the injection step, and a thickness of the growth layer can be increased by increasing the duration. Composition of the growth layer can be controlled by adjusting a ratio of mixing between a gas containing titanium and a gas containing aluminum in the first gas. For example, by increasing a ratio of mixing of the $TiCl_4$ gas in the first gas, a content of Ti in the growth layer can be increased, and in contrast, by increasing a ratio of mixing of the $AlCl_3$ gas in the first gas, a content of Al in the growth layer can be increased.

A growth face of second unit layer 13 can be set to any of the (200) plane and the (111) plane by adjusting a molar ratio between the gas containing titanium and the gas containing aluminum in the first gas in the present step. Specifically, by adjusting a molar ratio ($AlCl_3/TiCl_4$) between $AlCl_3$ and $TiCl_4$ in the first gas to less than 3.0, the growth face of second unit layer 13 can be set to the (200) plane. Such second unit layer 13 has the peak highest in intensity in the X-ray diffraction spectrum thereof, which is derived from the (200) plane as described previously. By adjusting a molar ratio ($AlCl_3/TiCl_4$) between $AlCl_3$ and $TiCl_4$ to 3.0 or higher, the growth face of second unit layer 13 can be set to the (111) plane. Such second unit layer 13 has the peak highest in intensity in the X-ray diffraction spectrum thereof, which is derived from the (111) plane as described previously.

A duration of the injection step and a content of Ti and Al in the growth layer also affect a construction of the multi-layer-structure-containing layer formed through the annealing step and the cooling step which will be described later. For example, when a thickness of the growth layer increases, the number of periods of a stack of the first unit layer and the second unit layer also tends to increase. When a content of Ti in the growth layer is high, a thickness of the first unit layer tends to be large or a content of Ti in the second unit layer tends to be high. In contrast, when a content of Al in the growth layer is high, a thickness of the second unit layer tends to be large or a content of Al in the second unit layer tends to be high.

<Annealing Step>

In the present step, the substrate which has been subjected to the injection step is annealed under a heating condition not lower than 850° C. and not higher than 1000° C. for a period not shorter than 5 minutes and not longer than 30 minutes. Specifically, in the present step, while only a carrier gas continues to be introduced without introduction of the first gas and the second gas from introduction pipe 27 and substrate 11 which has been subjected to the injection step remains arranged in reaction vessel 23, reaction vessel 23 is heated to a temperature not lower than 850° C. and not higher than 1000° C. for a period not shorter than 5 minutes and not longer than 30 minutes. Thus, substrate 11 on which the growth layer has been formed is annealed.

<Cooling Step>

In the present step, the substrate which has been subjected to the annealing step is cooled at a cooling rate not less than 7° C./min. Specifically, reaction vessel 23 in which substrate 11 which has been subjected to the annealing step is arranged is cooled such that a temperature of substrate 11 lowers at a rate not less than 7° C./min. When substrate 11 which has been subjected to the injection step is cooled by being left as it is (natural cooling), the rate of cooling is approximate from 3° C./min. to 4° C./min., and does not exceed 5° C./min.

Though details of the reason why the multi-layer-structure-containing layer described above is formed by performing the CVD step as described above are unclear, the present inventors estimate as follows, based on results of various studies.

The growth layer formed in the injection step is composed of TiAlN having the fcc crystal structure (hereinafter also referred to as "fcc-TiAlN"). When a content of Al is high, a crystal structure of TiAlN is unstable. As the growth layer having such an unstable crystal structure is successively annealed, TiAlN undergoes spinodal decomposition and phase separation takes place in the growth layer.

In phase separation, the growth layer composed of fcc-TiAlN becomes a three-layered structure of a layer composed of fcc-AlN, a layer composed of fcc-TiAlN, and a layer composed of fcc-TiN. Thereafter, elements of aluminum and titanium are dispersed, which leads to decrease in thickness of the layer composed of fcc-AlN and the layer composed of fcc-TiN, and to decrease in thickness of the layer composed of fcc-TiAlN. In an initial stage of the three-layered structure, the layer composed of fcc-TiAlN is considered to extremely be thinner than the layer composed of fcc-AlN or the layer composed of fcc-TiN.

The layer composed of fcc-AlN and the layer composed of fcc-TiN decrease in thickness. Since aluminum is higher in rate of dispersion than titanium, the layer composed of fcc-AlN tends to disappear first. Therefore, by appropriately setting a temperature and a period for annealing as described above, a structure in which the layer composed of fcc-Ti$_{1-x}$Al$_x$N and the layer composed of fcc-TiN are alternately stacked is obtained without the layer composed of fcc-TiN disappearing. Since Al is sufficiently dispersed, x in the layer composed of Ti$_{1-x}$Al$_x$N can have a high numeric value not smaller than 0.6 and not greater than 0.9.

Even though the structure in which the layer composed of fcc-Ti$_{1-x}$Al$_x$N and the layer composed of fcc-TiN are alternately stacked is formed in a process of phase separation, when this coating is subsequently cooled at a low rate as in natural cooling or when a time period for annealing is set to be longer than the period above, the multi-layer-structure-containing layer cannot finally be formed. This may be because the layer composed of fcc-TiAlN which is present in the process of phase separation separates in phase to hcp-AlN and fcc-TiN in order to have a more stable crystal structure.

In contrast, in the manufacturing method in the present embodiment, the growth layer is cooled at a high cooling rate not less than 7° C./min. immediately after appropriate annealing. Therefore, it is considered that phase separation stops at the stage described above and consequently, the multi-layer-structure-containing layer including the multi-layer structure in which the first unit layer composed of fcc-TiN and the second unit layer composed of fcc-Ti$_{1-x}$Al$_x$N are alternately stacked is formed.

Examples

The present invention will be described below in further detail with reference to Examples. In the description below, a thickness of each layer was measured by observing a cross-section of a coating with an SEM or a TEM as described previously, content x of Al in Ti$_{1-x}$Al$_x$N was measured with EDX as described previously, and compressive residual stress was measured with the sin$^2$ψ method as described previously.

<Substrate>

Initially, a substrate L and a substrate M shown in Table 1 below were prepared as substrates on which a coating was to be formed. Specifically, initially, source material powders having formulated composition shown in Table 1 were uniformly mixed. "Remainder" in Table 1 means that WC occupies the remainder of the formulated composition (mass %). Then, these mixed powders were pressurized and formed into a prescribed shape, and thereafter they were sintered for 1 to 2 hours at 1300 to 1500° C. Thus, the substrate made of cemented carbide having a shape of CNMG120408NGU was obtained. This shape is of Sumitomo Electric Hardmetal, and it is a shape of a throwaway tip for turning.

TABLE 1

| | | Formulated Composition (Mass %) | | | |
|---|---|---|---|---|---|
| Type | | Co | Cr$_3$C$_2$ | TaC | WC |
| Substrate | L | 5.2 | 0.5 | — | Remainder |
| | M | 10.0 | — | 2.0 | Remainder |

<Coating>

Coatings (Nos. 1 to 21) each having a structure shown in Table 2 were fabricated on the surface of the fabricated substrate. Thus, cutting tools (Nos. 1 to 21) in which the coatings were formed on the substrates, respectively, were obtained.

TABLE 2

Construction and Average Thickness of Each Layer

| No. | Substrate Type | Underlying Layer (μm) | Intermediate Layer (μm) | Surface Layer (μm) | Entire Coating (μm) |
|---|---|---|---|---|---|
| 1 | L | TiN(0.5)—TiCN(2.5) | a (4.0) | — | 7.0 |
| 2 | L | TiN(0.5)—TiCN(2.5) | b (3.0) | — | 6.0 |
| 3 | L | TiN(0.5)—TiCN(2.5) | d (6.5) | — | 9.5 |
| 4 | L | TiN(0.5)—TiCN(2.5) | f (10.0) | — | 13.0 |
| 5 | L | TiN(1.5) | c (10.0) | — | 11.5 |
| 6 | L | TiN(1.5) | b (10.0) | — | 11.5 |
| 7 | L | TiN(1.5) | g (7.0) | — | 8.5 |
| 8 | L | TiN(1.5) | e (13.0) | — | 14.5 |
| 9 | L | TiN(0.5)—TiCN(5.0) | d (6.0) | — | 11.5 |
| 10 | M | TiN(1.0) | b (5.0) | TiN(1.0) | 7.0 |
| 11 | M | TiN(1.0) | d (6.5) | — | 7.5 |
| 12 | M | TiN(1.0) | g (5.5) | — | 6.5 |
| 13 | M | TiN(1.0)—TiCN(3.0) | f (5.0) | TiN(0.5) | 9.5 |
| 14 | M | TiN(1.0)—TiCN(3.0) | a (4.0) | — | 8.0 |
| 15 | M | TiN(1.0)—TiCN(3.0) | b (2.5) | TiBN(0.5)—Al$_2$O$_3$(1.0) | 8.0 |
| 16 | L | TiN(1.0) | x (9.0) | — | 10.0 |
| 17 | L | TiN(0.5)—TiCN(2.5) | x (5.0) | — | 8.0 |
| 18 | M | TiN(1.0) | x (5.0) | TiN(1.0) | 7.0 |
| 19 | L | TiN(0.5)—TiCN(2.5) | y (5.0) | — | 8.0 |
| 20 | L | TiN(1.5) | y (10.0) | TiN(0.5) | 11.5 |
| 21 | M | TiN(1.0)—TiCN(3.0) | y (5.0) | — | 9.0 |

In Table 2, an underlying layer is an innermost layer of the coating and is in direct contact with the surface of the substrate, an intermediate layer is formed on the underlying layer, and a surface layer is formed on the intermediate layer. When two layers are shown in one field, the left layer means a lower layer. A field shown only with "−" means that no such layer is provided.

For example, cutting tool No. 15 in Table 2 has such a construction that an underlying layer formed from a TiN layer having a thickness of 1.0 μm and a TiCN layer having a thickness of 3.0 μm was formed on the surface of substrate M, an intermediate layer having a thickness of 2.5 μm which was formed under a formation condition b (which will be described later) was formed thereon, and a surface layer formed from a TiBN layer having a thickness of 0.5 μm and an Al$_2$O$_3$ layer having a thickness of 1.0 μm was formed thereon, and a thickness of the entire coating formed from these layers is shown to be 8.0 μm.

The underlying layer and the surface layer shown in Table 2 are layers formed with conventionally known CVD and conditions for forming the same are as shown in Table 3. For example, in a row of "TiN (Underlying Layer)" in Table 3, conditions for forming the TiN layer as the underlying layer are shown. Referring to Table 3, the TiN layer was formed by arranging the substrate in the reaction vessel of the CVD apparatus (an environment in the vessel was set to 6.7 kPa and 915° C.) and injecting a mixed gas composed of 2 volume % of the TiCl$_4$ gas, 39.7 volume % of the N$_2$ gas, and remainder 58.3 volume % of the H$_2$ gas at a flow rate of 63.8 L/min. into the reaction vessel. Such a representation is also the same for other layers shown in Table 3.

TABLE 3

| Type | Film Formation Condition Reaction Gas Composition (Volume %) | Reaction Atmosphere Pressure (kPa) | Temperature (° C.) | Total Amount of Gases (L/min) |
|---|---|---|---|---|
| TiN (Underlying Layer) | TiCl$_4$ = 2.0%, N$_2$ = 39.7%, H$_2$ = Remainder | 6.7 | 915 | 63.8 |
| TiN (Surface Layer) | TiCl$_4$ = 0.5%, N$_2$ = 41.2%, H$_2$ = Remainder | 79.8 | 980 | 45.9 |
| TiCN | TiCl$_4$ = 2.0%, CH$_3$CN = 0.7%, H$_2$ = Remainder | 9 | 860 | 50.5 |
| TiBNO | TiCl$_4$ = 36.7%, BCl$_3$ = 0.1%, CO = 1.6%, CO$_2$ = 1.7%, N$_2$ = 61.7%, H$_2$ = Remainder | 6.7 | 980 | 80.3 |
| TiCNO | TiCl$_4$ = 2.1%, CO = 3.2%, CH$_4$ = 2.8%, N$_2$ = 23.7%, H$_2$ = Remainder | 16.0 | 1030 | 70.5 |
| Al$_2$O$_3$ | AlCl$_3$ = 1.6%, CO$_2$ = 4.5%, H$_2$S = 0.2%, HCl = 3.5%, H$_2$ = Remainder | 6.7 | 1000 | 46.2 |

Among the intermediate layers shown in Table 2, the intermediate layers of coatings Nos. 1 to 15 each correspond to the multi-layer-structure-containing layer described previously and were formed under any of formation conditions a to g. The intermediate layers of coatings Nos. 16 to 18 each correspond to the Ti$_{1-x}$Al$_x$N layer disclosed in Japanese Patent Laying-Open No. 7-205362 described previously and were formed under a formation condition x. The intermediate layers of coatings Nos. 19 to 21 each correspond to a layer having the multi-layer structure in which composition was continuously varied with a period of the TiN layer and the AlN layer from 0.4 nm to 50 nm as disclosed in Japanese National Patent Publication No. 2008-545063 described previously and were formed under a formation condition y. Details of formation conditions a to g are shown in Table 4 and Table 5.

TABLE 4

| | Injection Step | | | | | |
|---|---|---|---|---|---|---|
| Formation Condition | First Gas (mol/min) | Al/Ti Ratio | Second Gas (mol/min) | Time Period of Injection (hour) | Pressure in Furnace (kPa) | Temperature in Furnace (° C.) |
| a | $AlCl_3$(0.065) $TiCl_4$(0.025) $H_2$(2.9)/$N_2$(1.0) | 2.6 | $NH_3$(0.09) $N_2$(0.9) | 2.0 | 2.2 | 800 |
| b | $AlCl_3$(0.073) $TiCl_4$(0.025) $H_2$(2.9)/$N_2$(1.0) | 2.9 | $NH_3$(0.09) $N_2$(0.9) | 2.5 | 2.2 | 800 |
| c | $AlCl_3$(0.058) $TiCl_4$(0.032) $H_2$(2.9)/$N_2$(1.0) | 1.8 | $NH_3$(0.09) $N_2$(0.9) | 2.0 | 2.5 | 830 |
| d | $AlCl_3$(0.085) $TiCl_4$(0.030) $H_2$(2.9)/$N_2$(1.0) | 2.8 | $NH_3$(0.09) $N_2$(0.9) | 3.0 | 1.3 | 850 |
| e | $AlCl_3$(0.120) $TiCl_4$(0.060) $H_2$(2.9)/$N_2$(1.0) | 2.0 | $NH_3$(0.09) $N_2$(0.9) | 3.0 | 1.3 | 850 |
| f | $AlCl_3$(0.180) $TiCl_4$(0.060) $H_2$(2.9)/$N_2$(1.0) | 3.0 | $NH_3$(0.09) $N_2$(0.9) | 1.5 | 3.3 | 780 |
| g | $AlCl_3$(0.150) $TiCl_4$(0.025) $H_2$(2.9)/$N_2$(1.0) | 6.0 | $NH_3$(0.09) $N_2$(0.9) | 1.0 | 2.2 | 820 |

TABLE 5

| | Annealing Step and Cooling Step | | | |
|---|---|---|---|---|
| Formation Condition | Pressure in Furnace (kPa) | Annealing Temperature (° C.) | Time Period of Annealing (min) | Cooling Rate ° C./min |
| a | 100 | 900 | 10 | 15 |
| b | 100 | 900 | 15 | 15 |
| c | 100 | 870 | 20 | 15 |
| d | 100 | 900 | 5 | 20 |
| e | 100 | 900 | 10 | 15 |
| f | 100 | 850 | 25 | 15 |
| g | 100 | 900 | 20 | 15 |

Formation condition a will specifically be described with reference to Tables 4 and 5. Under formation condition a, the intermediate layer which was the multi-layer-structure-containing layer was formed as follows. Namely, initially, in the injection step, the first gas formed from the $AlCl_3$ gas and the $TiCl_4$ gas and the second gas formed from the $NH_3$ gas were introduced into the reaction vessel of the CVD apparatus shown in FIG. 3 where the substrate had been arranged through the introduction ports different from each other. Here, flow rates of the $AlCl_3$ gas and the $TiCl_4$ gas were adjusted to 0.065 mol/min. and 0.025 mol/min., respectively, and a flow rate of the $NH_3$ gas was adjusted to 0.09 mol/min.

The $H_2$ gas (flow rate: 2.9 mol/min.) and the $N_2$ gas (flow rate: 1.0 mol/min.) as the carrier gas were introduced through the introduction port for introducing the first gas, and the $N_2$ gas (flow rate: 0.9 mol/min.) as the carrier gas was introduced through the introduction port for introducing the second gas.

In the injection step, a pressure and a temperature in the reaction vessel were maintained at 2.2 kPa and 800° C., respectively, and the introduction pipe for introducing the first gas and the second gas was rotating around the axis thereof. After this injection step continued for 2 hours, introduction of the first gas and the second gas into the reaction vessel was stopped.

Then, in the annealing step, after a temperature in the reaction vessel after the injection step was increased to 900° C., this state was maintained for 10 minutes and the substrate in the reaction vessel was annealed. A pressure in the reaction vessel here was maintained at 100 kPa.

Then, in the cooling step, by forcibly cooling the reaction vessel containing the substrate which had been subjected to the annealing step, a temperature of the substrate was lowered at a cooling rate of 15° C./min., so as to cool the formed coating. Through the steps above, the intermediate layer which was the multi-layer-structure-containing layer was formed. Similarly, under other formation conditions b to g as well, the intermediate layers which were each the multi-layer-structure-containing layer were formed under conditions shown in Table 4 and Table 5.

In connection with formation condition x, the intermediate layer was formed with PVD disclosed in Japanese Patent Laying-Open No. 7-205362. Specifically, initially, a Ti target was set on one side in a furnace of a vapor deposition apparatus used for PVD, an Al target was set opposite thereto, and a substrate was arranged on a turntable in the center between the targets. Then, while the turntable was turned at 50 rpm/min., the $N_2$ gas was introduced into the furnace at 3000 cc/min., and the Ti target and the Al target were evaporated and ionized through vacuum arc discharge. A pressure and a temperature in the furnace here were maintained at $1 \times 10^{-2}$ Torr and 500° C., respectively. By performing a PVD process under this condition for 600 minutes, an intermediate layer having a thickness of 9.0 μm was formed, and by performing the PVD process for 340 minutes, an intermediate layer having a thickness of 5.0 μm was formed.

In connection with formation condition y, the intermediate layer was formed with conventional CVD disclosed in Japanese National Patent Publication No. 2008-545063. Specifically, initially, in the injection step, the first gas formed from the $AlCl_3$ gas and the $TiCl_4$ gas and the second gas formed from the $NH_3$ gas were introduced into the reaction vessel of the CVD apparatus shown in FIG. 3 where the substrate had been arranged through the introduction ports different from each other. Here, flow rates of the $AlCl_3$ gas and the $TiCl_4$ gas were adjusted to 0.0009 mol/min. and 0.00015 mol/min., respectively, and a flow rate of the $NH_3$ gas was adjusted to 0.09 mol/min. The $H_2$ gas (flow rate: 2.9 mol/min.) and the $N_2$ gas (flow rate: 1.0 mol/min.) as the carrier gas were introduced through the introduction port for introducing the first gas, and the $N_2$ gas (flow rate: 0.9 mol/min.) as the carrier gas was introduced through the introduction port for introducing the second gas.

In the injection step, a pressure and a temperature in the reaction vessel were maintained at 1.0 kPa and 800° C., respectively, and the introduction pipe for introducing the first gas and the second gas was rotating around the axis thereof. After this injection step continued for a prescribed period of time, introduction of the first gas and the second gas into the reaction vessel was stopped.

Then, after the injection step, unlike formation conditions a to g, the substrate was cooled by being left as it is without annealing the substrate which had been subjected to the injection step and without forcibly cooling the substrate. A rate of cooling of the substrate by being left as it is was 3.5° C./min. When the injection step continued for 5 hours, an intermediate layer having a thickness of 5 μm was formed, and when the injection step continued for 10 hours, an intermediate layer having a thickness of 10 μm was formed.

TABLE 6

| | Characteristics of Intermediate Layer | | |
|---|---|---|---|
| Formation Condition | Thickness of TiN layer and $Ti_{1-x}Al_xN$ Layer (nm) | Content of Al in $Ti_{1-x}Al_xN$ Layer (Atomic Ratio) | The Number of Layers in Stack Structure |
| a | 20 | 0.65 | 150 |
| b | 25 | 0.62 | 135 |
| c | 18 | 0.66 | 170 |
| d | 15 | 0.70 | 220 |
| e | 30 | 0.60 | 100 |
| f | 20 | 0.65 | 150 |
| g | 25 | 0.81 | 125 |
| x | Layer Formed From Stack Structure of TiN (4 nm)/AlN (4 nm) | | — |
| y | Layer Formed From Single Layer Mainly Composed of $Ti_{0.1}Al_{0.9}N$ | | — |

Table 6 shows a detailed construction of the intermediate layers formed under formation conditions a to g, x, and y. Referring to Table 6, in the multi-layer-structure-containing layers formed under formation conditions a to g, the TiN layer and the $Ti_{1-x}Al_xN$ layer in each multi-layer-structure-containing layer were equivalent in thickness to each other as shown in Table 6. Content x of Al in the $Ti_{1-x}Al_xN$ layer was not smaller than 0.6 and not greater than 0.9 as shown in Table 6. In the multi-layer-structure-containing layer, the number of layers in the stack structure is as shown in Table 6, and it was 100 or more. Namely, the stack structure of this multi-layer-structure-containing layer is categorized into a super multi-layer structure. The multi-layer-structure-containing layer having the columnar crystal region and the multi-layer structure being formed in the columnar crystal region were also confirmed through observation with a TEM. The intermediate layer formed under formation condition x was a layer (an AlN/TiN layer) having a stack structure in which the TiN layer having a thickness of 4 nm and the AlN layer having a thickness of 4 nm were alternately stacked, and the intermediate layer formed under formation condition y was a layer (a $Ti_{0.1}Al_{0.9}N$ layer) formed from a single layer mainly composed of $Ti_{0.1}Al_{0.9}N$.

<Characteristics of Multi-Layer-Structure-Containing Layer>

As characteristics of the multi-layer-structure-containing layer, an X-ray diffraction spectrum of the $Ti_{1-x}Al_xN$ layer included in the intermediate layer formed under each of formation conditions a to g was observed, from which plane the peak exhibiting the highest intensity was derived was checked, and compressive residual stress in the $Ti_{1-x}Al_xN$ layer was measured with the $\sin^2 \psi$ method using X-rays. Table 7 shows results. Characteristics of the $Ti_{1-x}Al_xN$ layer included in the intermediate layer of the coating of each of samples Nos. 1 to 15 were confirmed. Then, the characteristics matched for each formation condition, and hence results for each formation condition not for each sample No. are shown in Table 7.

TABLE 7

| | Characteristics of Intermediate Layer | |
|---|---|---|
| Formation Condition | Peak Plane Highest in Intensity | Compressive Residual Stress (GPa) |
| a | (200) | −0.8 |
| b | (200) | −1.0 |
| c | (200) | −1.5 |
| d | (200) | −1.0 |
| e | (200) | −0.4 |
| f | (111) | −1.7 |
| g | (111) | −0.8 |

Referring to Table 7, it was confirmed that, in the $Ti_{1-x}Al_xN$ layer each included in the intermediate layer formed under formation conditions a to e, the peak derived from the (200) plane exhibited the highest intensity in the X-ray diffraction spectrum, and in the $Ti_{1-x}Al_xN$ layer each included in the intermediate layer formed under formation conditions f and g, the peak derived from the (111) plane exhibited the highest intensity in the X-ray diffraction spectrum. It was confirmed that the absolute value of compressive residual stress in the $Ti_{1-x}Al_xN$ layer was not greater than 2.0 GPa in the intermediate layer formed under any formation condition.

<Evaluation of Cutting Performance>

Cutting tests 1 to 5 below were conducted for manufactured cutting tools Nos. 1 to 21, and cutting performance of each cutting tool was evaluated.

<Cutting Test 1>

A time period of cutting until an amount of wear of a flank face (Vb) attained to 0.20 mm under a cutting condition below for a cutting tool having No. shown in Table 8 below was counted and a final form of damage of a cutting edge was observed. Table 8 shows results. A longer time period of cutting indicates excellent resistance to wear. The final form of damage being close to normal wear indicates excellent resistance to adhesion.

<Conditions for Cutting>

Work material: cutting of outer circumference of SUS316 round rod
Peripheral speed: 150 m/min.
Feed rate: 0.15 mm/rev.
Depth of cut: 1.0 mm
Cutting liquid: used

TABLE 8

| No. | Time Period of Cutting (minute) | Final Form of Damage |
|---|---|---|
| 1 | 20.0 | Normal Wear |
| 3 | 25.0 | Normal Wear |

TABLE 8-continued

| No. | Time Period of Cutting (minute) | Final Form of Damage |
|---|---|---|
| 7 | 25.0 | Normal Wear |
| 9 | 30.0 | Normal Wear |
| 16 | 10.0 | Normal Wear |
| 17 | 5.0 | Normal Wear |
| 19 | 15.0 | Normal Wear |

As is clear from Table 8, cutting tools Nos. 1, 3, 7, and 9 were better in resistance to wear than cutting tools Nos. 16, 17, and 19. In the final form of damage in Table 8, "normal wear" means a form of damage without chipping or fracture but only with wear (having a smooth worn surface). It was confirmed from this result that the cutting tools (Nos. 1, 3, 7, and 9) each coated with the coating including the multi-layer-structure-containing layer were better in resistance to wear than the cutting tools (Nos. 16 and 17) each coated with the coating including the AlN/TiN layer and the cutting tool (No. 19) coated with the coating including the $Ti_{0.1}Al_{0.9}N$ layer. This may be because the coating including the multi-layer-structure-containing layer is higher in hardness and resistance to oxidation than other coatings.

<Cutting Test 2>

A time period of cutting until an amount of wear of a flank face (Vb) attained to 0.20 mm under a cutting condition below for a cutting tool having No. shown in Table 9 below was counted and a final form of damage of a cutting edge was observed. Table 9 shows results. A longer time period of cutting indicates excellent resistance to wear. The final form of damage being close to normal wear indicates excellent resistance to adhesion.

<Conditions for Cutting>
Work material: cutting of outer circumference of SUS304 round rod
Peripheral speed: 200 m/min.
Feed rate: 0.15 mm/rev.
Depth of cut: 1.0 mm
Cutting liquid: used

TABLE 9

| No. | Time Period of Cutting (minute) | Final Form of Damage |
|---|---|---|
| 1 | 20.0 | Normal Wear |
| 4 | 18.0 | Normal Wear |
| 5 | 20.0 | Normal Wear |
| 8 | 17.0 | Normal Wear |
| 17 | 13.0 | Chipping |
| 19 | 7.0 | Breakage |

As is clear from Table 9, cutting tools Nos. 1, 4, 5, and 8 were better in resistance to wear and adhesion than cutting tools Nos. 17 and 19. In the final form of damage in Table 9, "normal wear" means a form of damage without chipping or fracture but only with wear (having a smooth worn surface), "breakage" means a large fracture caused in a cutting edge portion, and "chipping" means a minor fracture caused in a cutting edge portion producing a finished surface. It was confirmed from this result that the cutting tools (Nos. 1, 4, 5, and 8) each coated with the coating including the multi-layer-structure-containing layer were better in resistance to wear and resistance to adhesion than the cutting tool (No. 17) coated with the coating including the AlN/TiN layer and the cutting tool (No. 19) coated with the coating including the $Ti_{0.1}Al_{0.9}N$ layer. This may be because the coating including the multi-layer-structure-containing layer is higher in hardness and resistance to oxidation than other coatings.

<Cutting Test 3>

A time period of cutting (minutes) until breakage or chipping occurred at the cutting edge portion of a tool under a cutting condition below for a cutting tool having No. shown in Table 10 below was counted. Table 10 shows results. A longer time period of cutting indicates excellent resistance to fatigue toughness.

<Conditions for Cutting>
Work material: SCM435 grooved
Peripheral speed: 350 m/min.
Feed rate: 0.15 mm/s
Depth of cut: 1.0 mm
Cutting liquid: used

TABLE 10

| No. | Time Period of Cutting (minute) |
|---|---|
| 1 | 5.0 |
| 2 | 5.0 |
| 3 | 5.0 |
| 5 | 4.0 |
| 6 | 4.5 |
| 17 | 5.0 |
| 19 | 3.0 |
| 20 | 1.0 |

As is clear from Table 10, cutting tools Nos. 1, 2, 3, 5, and 6 were better in resistance to fatigue toughness than cutting tools Nos. 17, 19, and 20. It was confirmed from this result that the cutting tools (Nos. 1, 2, 3, 5, and 6) each coated with the coating including the multi-layer-structure-containing layer were better in resistance to fatigue toughness and hence better in cutting performance than the cutting tool (No. 17) coated with the coating including the AlN/TiN layer and the cutting tools (Nos. 19 and 20) each coated with the coating including the $Ti_{0.1}Al_{0.9}N$ layer. This may be because the coating including the multi-layer-structure-containing layer is higher in hardness and resistance to oxidation than other coatings.

<Cutting Test 4>

For a cutting tool having No. shown in Table 11 below, the number of paths and a distance of cutting until breakage or until an amount of wear of a flank face (Vb) attained to 0.20 mm under a cutting condition below were determined and a final form of damage of a cutting edge was observed. Table 11 shows results. The larger number of paths (that is, a longer distance of cutting) indicates excellent resistance to wear. The final form of damage being close to normal wear indicates excellent resistance to shock.

The number of paths means the number of repeated operations of milling by a cutter having one cutting tool (a throwaway chip) attached from one end to the other end of one side surface (a surface of 300 mm×80 mm) of a work material below (shape: a block of 300 mm×100 mm×80 mm) (the number of paths having a numeric value to the right of the decimal point indicates that conditions above were satisfied at some point from one end to the other end). The distance of cutting means a total distance of a work material cut until the conditions above were satisfied, and corresponds to a product of the number of paths and a length (300 mm) of the side surface.

<Conditions for Cutting>
Work material: FCD700 block material
Peripheral speed: 150 m/min.
Feed rate: 0.2 mm/s
Depth of cut: 2.0 mm
Cutting liquid: not used
Cutter: WEX3032E (manufactured by Sumitomo Electric Hardmetal)
Tip: AXMT170508PEER-G single edge (manufactured by Sumitomo Electric Hardmetal)

TABLE 11

| No. | The Number of Paths | Distance of Cutting (m) | Final Form of Damage |
|---|---|---|---|
| 10 | 15.0 | 4.5 | Normal Wear |
| 11 | 15.0 | 4.5 | Normal Wear |
| 13 | 17.0 | 5.1 | Normal Wear |
| 15 | 18.0 | 5.4 | Normal Wear |
| 18 | 3.0 | 0.9 | Normal Wear |
| 21 | 9.0 | 2.7 | Normal Wear |

As is clear from Table 11, cutting tools Nos. 10, 11, 13, and 15 were better in resistance to wear than cutting tools Nos. 18 and 21. In the final form of damage in Table 11, "normal wear" means a form of damage without chipping or fracture but only with wear (having a smooth worn surface). It was confirmed from this result that the cutting tools (Nos. 10, 11, 13, and 15) each coated with the coating including the multi-layer-structure-containing layer were better in resistance to wear and hence in cutting performance than the cutting tool (No. 18) coated with the coating including the AlN/TiN layer and the cutting tool (No. 21) coated with the coating including the $Ti_{0.1}Al_{0.9}N$ layer. This may be because the coating including the multi-layer-structure-containing layer is higher in hardness and resistance to oxidation than other coatings.

<Cutting Test 5>

For a cutting tool having No. shown in Table 12 below, the number of paths and a distance of cutting until breakage or until an amount of wear of a flank face (Vb) attained to 0.20 mm under a cutting condition below were determined and a final form of damage of a cutting edge was observed. Table 12 shows results. The larger number of paths (that is, a longer distance of cutting) indicates excellent resistance to wear. The final form of damage being close to normal wear indicates excellent resistance to shock.

<Conditions for Cutting>
Work material: SUS304 block material
Peripheral speed: 200 m/min.
Feed rate: 0.2 mm/s
Depth of cut: 2.0 mm
Cutting liquid: not used
Cutter: WEX3032E (manufactured by Sumitomo Electric Hardmetal)
Tip: AXMT170508PEER-G single edge (manufactured by Sumitomo Electric Hardmetal)

TABLE 12

| No. | The Number of Paths | Distance of Cutting (m) | Final Form of Damage |
|---|---|---|---|
| 10 | 14.0 | 4.2 | Normal Wear |
| 12 | 15.0 | 4.5 | Normal Wear |
| 13 | 15.0 | 4.5 | Normal Wear |
| 14 | 15.0 | 4.5 | Normal Wear |

TABLE 12-continued

| No. | The Number of Paths | Distance of Cutting (m) | Final Form of Damage |
|---|---|---|---|
| 18 | 9.0 | 2.7 | Chipping |
| 21 | 6.0 | 1.8 | Chipping |

As is clear from Table 12, cutting tools Nos. 10, 12, 13, and 14 were better in both of resistance to wear and resistance to shock than cutting tools Nos. 18 and 21. In the final form of damage in Table 12, "normal wear" means a form of damage without chipping or fracture but only with wear (having a smooth worn surface) and "chipping" means a minor fracture caused in a cutting edge portion. It was confirmed from this result that the cutting tools (Nos. 10, 12, 13, and 14) each coated with the coating including the multi-layer-structure-containing layer were better in resistance to wear and hence in cutting performance than the cutting tool (No. 18) coated with the coating including the AlN/TiN layer and the cutting tool (No. 21) coated with the coating including the $Ti_{0.1}Al_{0.9}N$ layer. This may be because the coating including the multi-layer-structure-containing layer is higher in hardness and resistance to oxidation than other coatings.

As is clear from cutting tests 1 to 5 above, cutting tools (Nos. 1 to 15) each including the coating including the multi-layer-structure-containing layer according to the present embodiment were better in cutting performance than other cutting tools (Nos. 16 to 21). This may be because the coating including the multi-layer-structure-containing layer is higher in hardness and resistance to oxidation than other TiN/AlN layer or $Ti_{0.1}Al_{0.9}N$ layer.

Although an embodiment of the present invention has been described, it should be understood that the embodiment disclosed herein is illustrative and non-restrictive in every respect. The scope of the present invention is defined by the terms of the claims, and is intended to include any modifications within the scope and meaning equivalent to the terms of the claims.

What is claimed is:

1. A coating, comprising one layer or two or more layers, at least one layer of said layers including a multi-layer structure in which a first unit layer composed of TiN and a second unit layer composed of $Ti_{1-x}Al_xN$ are alternately stacked,
said first unit layer having an fcc crystal structure, and
said second unit layer having an fcc crystal structure, X in said $Ti_{1-x}Al_xN$ being not smaller than 0.6 and not greater than 0.9,
wherein said second unit layer has compressive residual stress of which absolute value is not greater than 1 GPa.

2. The coating according to claim 1, wherein
said second unit layer has a peak highest in intensity in an X-ray diffraction spectrum, which is derived from a (111) plane or a (200) plane.

3. The coating according to claim 1, wherein
in said multi-layer structure, a distance between said first unit layers adjacent to each other with said second unit layer lying therebetween is not smaller than 10 nm and not greater than 40 nm.

4. A cutting tool, comprising:
a substrate; and
the coating according to claim 1 with which said substrate is coated.

5. The cutting tool according to claim 4, wherein said substrate is composed of cemented carbide or cermet.

* * * * *